(12) United States Patent
Jurgens et al.

(10) Patent No.: US 7,076,759 B2
(45) Date of Patent: Jul. 11, 2006

(54) METHODOLOGY FOR GENERATING A MODIFIED VIEW OF A CIRCUIT LAYOUT

(75) Inventors: Michael S. Jurgens, Urbana, MD (US); Benjamin T. Madden, Roxbury, MA (US)

(73) Assignee: LSI Logic Corporation, Milpitas, CA (US)

( * ) Notice: Subject to any disclaimer, the term of this patent is extended or adjusted under 35 U.S.C. 154(b) by 368 days.

(21) Appl. No.: 10/649,215

(22) Filed: Aug. 26, 2003

(65) Prior Publication Data
US 2005/0050504 A1    Mar. 3, 2005

(51) Int. Cl.
G06F 9/455    (2006.01)
G06F 9/45     (2006.01)
G06F 17/50    (2006.01)

(52) U.S. Cl. ............. 716/11; 716/4; 716/8; 716/12

(58) Field of Classification Search .......... 716/11, 716/4, 8, 12
See application file for complete search history.

(56) References Cited

U.S. PATENT DOCUMENTS

| | | | |
|---|---|---|---|
| 5,623,420 A * | 4/1997 | Yee et al. | 716/1 |
| 6,093,214 A * | 7/2000 | Dillon | 716/17 |
| 6,374,395 B1 * | 4/2002 | Wang | 716/11 |
| 6,543,040 B1 * | 4/2003 | Bednar et al. | 716/7 |
| 6,883,155 B1 * | 4/2005 | Bednar et al. | 716/8 |
| 2004/0049754 A1 * | 3/2004 | Liao et al. | 716/8 |
| 2004/0083440 A1 * | 4/2004 | Houston | 716/8 |
| 2004/0143806 A1 * | 7/2004 | Kodama et al. | 716/5 |
| 2005/0097493 A1 * | 5/2005 | Monthie et al. | 716/11 |

OTHER PUBLICATIONS

"Using 'empty space' for IC congestion relief", By Tsu-Wei Ku, Eedesign, Jun. 19, 2003, pp. 1-7.

* cited by examiner

Primary Examiner—Stacy A. Whitmore
Assistant Examiner—Magid Y. Dimyan
(74) Attorney, Agent, or Firm—Christopher P. Maiorana, P.C.

(57) ABSTRACT

A method for generating a modified view of a circuit layout. In a first step, the method includes receiving the circuit layout from a design rule clean database. In a second step, the method includes extracting a base wafer layout from the circuit layout according to a set of computer executable instructions. In a third step, the method includes modifying the base wafer layout according to the set of computer executable instructions.

20 Claims, 3 Drawing Sheets

METHODOLOGY FOR GENERATING A MODIFIED VIEW OF A CIRCUIT LAYOUT

FIELD OF THE INVENTION

The present invention relates to semiconductor layout generally and, more particularly, to a method and/or tool for creating a modified view of existing IP so routing resources may be used if IP is not used and base layers will remain unchanged.

BACKGROUND OF THE INVENTION

Referring to FIG. 1, a block diagram of a chip 10 is shown. The chip 10 can include a number of diffused blocks 12. In one example, the diffused blocks 12 can be hard macros or random access memories (RAMs). The diffused blocks 12 can provide customized and/or optimized circuits for performing specific functions, for example, supporting high performance interface protocols, memory, etc.

Depending upon the application, the diffused blocks 12 can be used as part of a design for the chip 10 or left unused. According to conventional design rules, when the diffused blocks 12 are not used, the area occupied by the unused blocks is completely lost (i.e., the metal layers of the diffused block 12 are blocked). The conventional design solutions have disadvantages of (i) no routing through or over the unused diffused blocks, (ii) high congestion and cross-coupling effects over the unused diffused blocks, (iii) a large inventory because slices with and without diffused blocks can be required and (iv) huge databases result because the database contains complete views of all diffused blocks, even unused blocks.

It would be desirable to have a tool and/or method that facilitates reuse of resources of unused diffused blocks.

SUMMARY OF THE INVENTION

The present invention concerns a method for generating a modified view of a circuit layout comprising the steps of (A) receiving the circuit layout from a design rule clean database, (B) extracting a base wafer layout from the circuit layout according to a set of computer executable instructions and (C) modifying the base wafer layout according to the set of computer executable instructions.

The objects, features and advantages of the present invention include providing a method and/or tool for creating a modified view of existing IP that may (i) allow base layers of unused diffused blocks to remain unchanged, (ii) allow routing resources of unused diffused blocks to be reused, (iii) provide a netlist of modified views, (iv) extract control layers for clean DRC and LVS runs with metal layers removed, (v) provide an automated process and/or (vi) provide ease of use.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
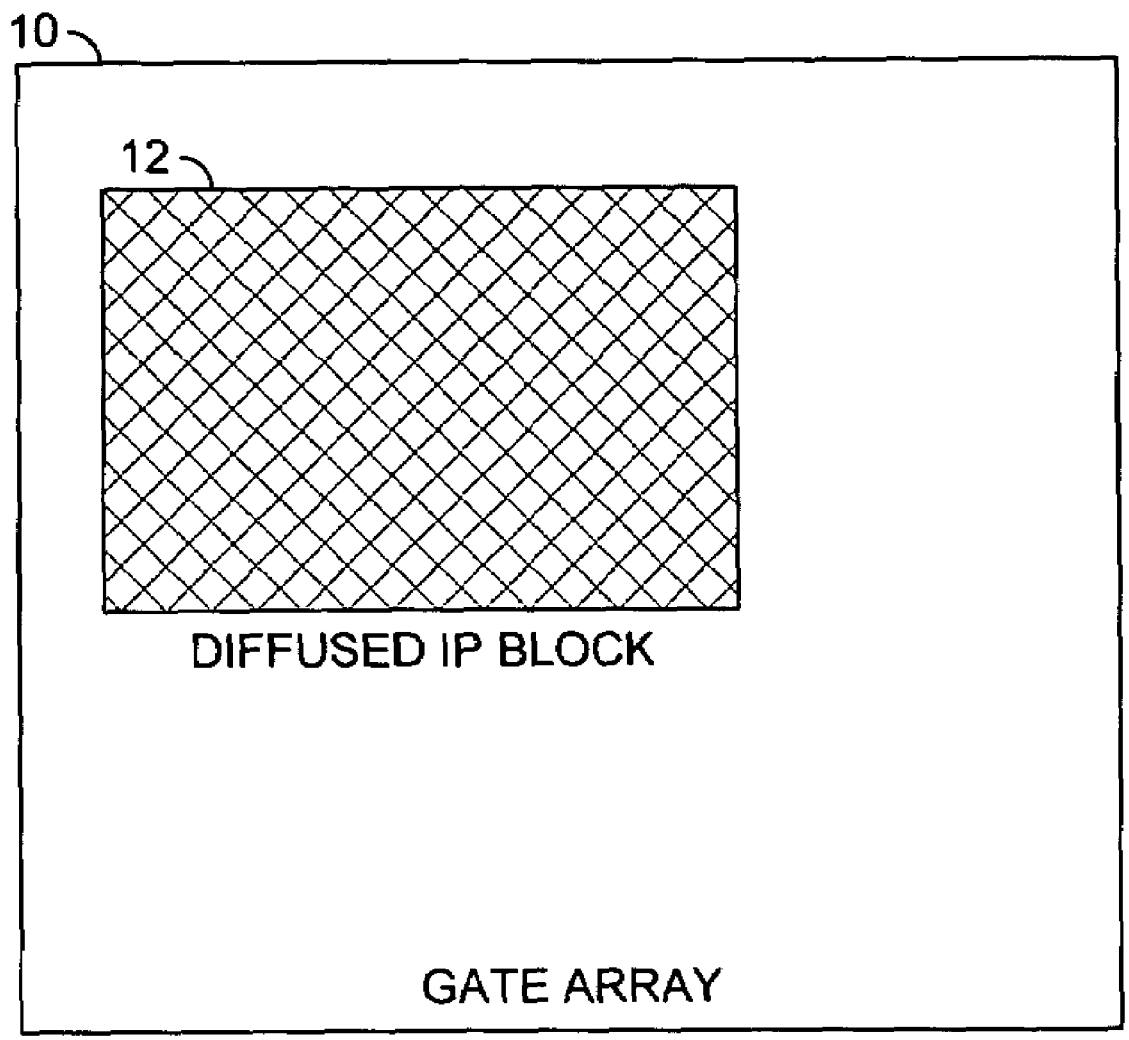
FIG. 1 is a block diagram illustrating a chip with a diffused block having all used layers blocked.
Figure 2:
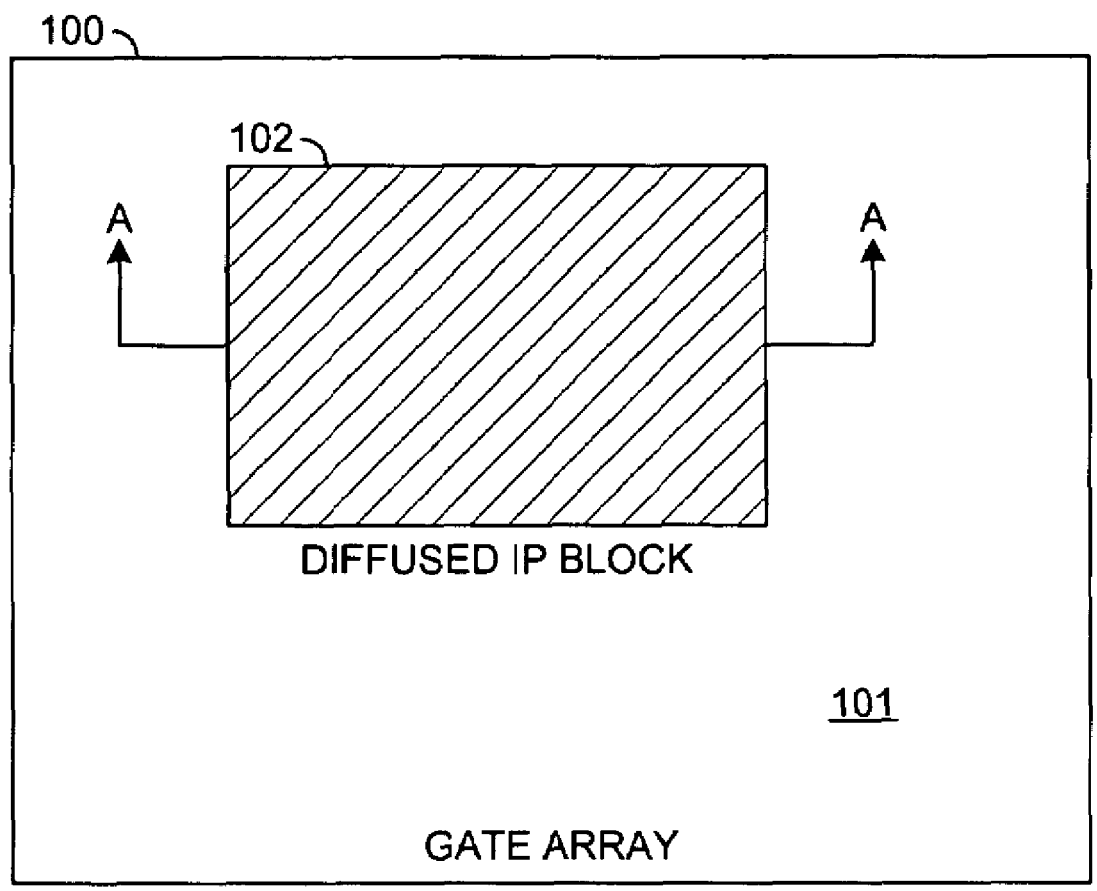
FIG. 2 is a block diagram illustrating a chip with a diffused block with extracted base layers and routing in accordance with a preferred embodiment of the present invention.
Figure 2:
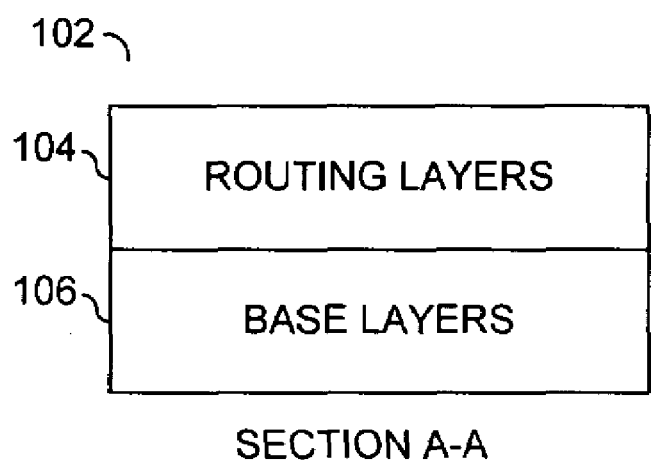

Referring to FIG. 2, a block diagram of a device 100 is shown in accordance with a preferred embodiment of the present invention. The device 100 may comprise a customizable chip or wafer. In one example, the device 100 may be customized via layers of metalization (e.g., wire layers). The device 100 may comprise one or more programmable gate array regions 101 and one or more diffused blocks 102. The diffused blocks 102 may comprise a number of layers that may be divided into two groups: 1) routing layers 104 and 2) base layers 106 (e.g., see section A—A of FIG. 2). The routing layers 104 generally comprise all of the metal layers of the diffused block 102. However, in one example, one or more metal layers may be included in the base layers 106 (e.g., routing for power).

The diffused block 102 may be unused in some applications of the device 100. When the diffused block 102 is unused, the present invention generally allows the unused resources (e.g., routing resources) of the block 102 to be reused. The reuse of the routing resources in accordance with a preferred embodiment of the present invention generally does not effect the base layers of the diffused block 102. The reuse of the routing resources of the block 102 may reduce routing congestion and increase cell utilization in the device 100.

In general, the base layers 106 of the unused one or more diffused blocks 102 may be insulated (or paved over) to allow full use of the routing layers 104 by other circuitry on the device 100. The present invention generally determines which diffused blocks 102 of the device 100 are unused and generates a representation of the base layers 106 of the unused diffused blocks 102 as a single cell (e.g., a paveover cell) that may be routed over. In general, the base layers 106 of each diffused block 102 are generally predetermined for each customizable wafer (or slice) 100.

Figure 3:
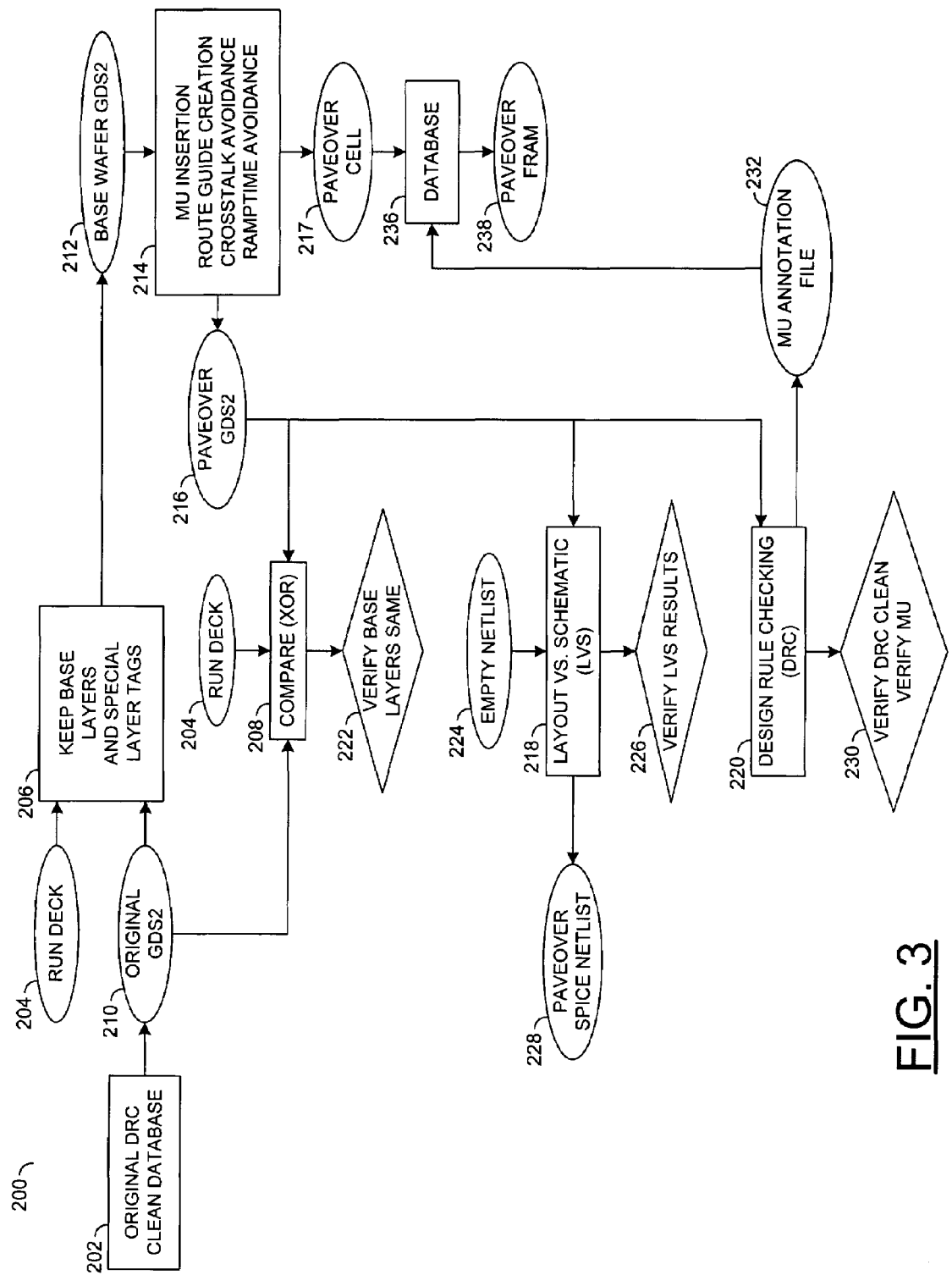
FIG. 3 is a flow diagram illustrating a preferred embodiment of the present invention.

Referring to FIG. 3, a flow diagram of a process 200 is shown in accordance with a preferred embodiment of the present invention. The process 200 may be implemented as a design tool comprising a set of computer readable instructions. The process 200 generally begins with an original design rule checking (DRC) clean database 202 for a circuit (or device design layout) and a set of computer executable instructions 204. The computer executable instructions may be configured to generate a modified view of the database 202. The set of computer executable instructions is generally referred to herein as a run deck. In one example, the instructions 204 may be implemented to control (or operate with) a commercially available tool suite (e.g., Calibre® by Mentor Graphics Corporation, Wilsonville, Oreg.).

The modified view generated in response to the run deck 204 generally facilitates reuse of, for example, routing resources of diffused blocks in the database 202 that are unused in a particular application. The original DRC clean database 202 is generally transferred via a first stream to a processing block 206 and a compare block 208. The transfer may use a standard file format 210 (e.g., GDS2, also known as GDSII). The processing block 206 generally extracts base layers and any special layer tags of any unused diffused blocks 102 in the original layout database 202 in response to the instructions of the run deck 204. The base layers information extracted from the database 202 may be transferred from the block 206 to a processing block 214 as a base wafer 212 via a second stream using, for example, the standard file format GDS2.

The processing block 214 is generally configured to process the base wafer 212 received from the block 206. For example, the processing performed by the block 214 may include, but is not limited to, performing metal utilization (MU) number insertion, creating route guides and adjusting the base wafer layout to avoid (or reduce) crosstalk and slew errors. For example, route guides may be generated based upon predetermined technology limits for routing distances and crosstalk issues such that available routing tracks do not exceed the predetermined limits.

The processing block 214 generally presents a paveover representation 216 of the base wafer 212 via, for example, a third GDS2 stream to (i) the compare block 208, (ii) a processing block 218 and (iii) a processing block 220. The processing block 214 is generally further configured to present a paveover cell 217 (e.g., a ghost view of the base layers that may be implemented (or exist) on a particular slice prior to customization). The paveover cell 217 generally comprises only the base layers 106 of the diffused blocks 102 from the layout design in the original database 202. The base layers 106 are generally determined based upon the particular technology employed by the design.

The processing block 208 is generally configured to compare the original layout data 210 received from the database 202 with the paveover data 216 received from the block 214 in response to one or more instructions from the run deck 204. In general, the processing block 208 may be configured to verify that the base layers information incorporated into the paveover representation is the same as (e.g., function similarly to) the base layers information in the original database 202 (e.g., the block 222). For example, the processing block 214 is generally configured in response to the run deck 204 to check layers in the paveover GDS2 stream 216 that are not to be changed from the original database 202 while ignoring layers that may change. In general, an exclusive-OR (XOR) comparison may be implemented to ensure that the original layout data and the paveover data compare correctly. For example, the comparison may be performed (e.g., with Calibre) to report any differences between the base layers of the original layout data in the stream 210 and the paveover data in the stream 216.

The processing block 218 is generally configured to perform a layout versus schematic (LVS) verification of the paveover design. In one example, a commercially available tool may be used to perform the verification. In general, the block 218 is configured to generate a paveover netlist 228 (e.g., a SPICE® netlist) in response to an empty netlist 224 and the paveover datastream 216. The processing block 218 generally verifies the layout versus schematic results (e.g., the block 226).

The processing block 220 is generally configured to perform design rule checking (DRC) on the paveover layout information received via the stream 216. The processing block 220 generally verifies that the paveover data is clean with respect to design rule checking and that the paveover data is clean with respect to metal utilization (mu) factors (e.g., the block 230). In one example, the processing block 220 may incorporate commercially available tools for performing the DRC operation. The processing block 220 is generally further configured to generate a mu annotation file 232 in response to the paveover data stream 216.

The process 200 is generally configured to generate a paveover database 236 in response to the paveover cell 217 and the mu annotation file 232. The paveover database 236 may be presented, in one example, as Synopsys Milkyway FRAM views 238 or a Milkyway library database. For applications that do not use one or more of the diffused IP blocks 102, the paveover database 236 may be substituted for the original database 202 in subsequent design steps.

The computer executable instructions of the run deck 204 are generally configured to extract the base layers of unused diffused blocks into the paveover cell and leave the unused routing (metal) layers available for other routing needs of the particular design layout. The base layers are generally predetermined by the particular technology. In general, the run deck 204 is generated for the particular technology employed. The instructions of the run deck 204 are generally further configured to flatten the paveover cell (e.g., fix (or group) the elements of the paveover cell as a single block). By flattening the paveover cell, the process 200 generally avoids having subcells of the paveover cell (e.g., with the metal removed) replace subcells within other parts of the chip design.

The run deck 204 may be configured to extract control layers to facilitate clean DRC and LVS runs with the metal layers removed. For example, by extracting particular control layers, errors during the DRC and LVS operations may be avoided. Furthermore, the run deck instructions 204 may be configured to distinguish control layers that may be extracted to prevent potential problems when adding random access memory blocks to the paveover cell. For example, memories generally use different DRC rules.

The function performed by the flow diagram of FIG. 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, ASSPs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for generating a modified view of a circuit layout comprising the steps of:
   receiving circuit layout data from a design rule clean database;
   extracting base wafer layout data from said circuit layout data according to a set of computer executable instructions; and modifying said base wafer layout data by combining one or more unused diffused blocks to form a single paveover cell according to said set of computer executable instructions.

2. The method according to claim 1, wherein the step of extracting said base wafer layout data further comprises:
extracting data for base layers of said one or more unused diffused blocks from said circuit layout data.

3. The method according to claim 2, wherein the step of extracting said base wafer layout data further comprises:
extracting layer tags from said circuit layout data.

4. The method according to claim 3, wherein the step of modifying said base wafer layout data further comprises:
removing metal in the extracted base layers of said one or more unused diffused blocks; and
combining the extracted base layers of said one or more unused diffused blocks with said metal removed into said paveover cell.

5. The method according to claim 4, further comprising:
flattening said paveover cell.

6. The method according to claim 2, further comprising:
placing an insulating layer over said base layers of said one or more unused diffused blocks; and
placing routing over the insulated base layers of said one or more unused diffused blocks, wherein said routing uses routing resources of said one or more unused diffused blocks.

7. The method according to claim 2, further comprising:
extracting data for one or more control layers of said one or more diffused blocks.

8. The method according to claim 7, wherein said data for said one or more control layers are extracted based upon any of (i) a clean design rule check (DRC), (ii) a clean layout versus schematic (LVS) check and (iii) both a clean DRC and a clean LVS check.

9. The method according to claim 2, wherein said one or more unused diffused blocks comprise one or more blocks selected from the group consisting of a hard macro, coreware, a standard cell and a memory.

10. The method according to claim 1, further comprising the step of:
comparing one or more base layers of the modified base wafer layout data with corresponding base layers of said circuit layout data.

11. The method according to claim 1, further comprising the steps of:
generating a modified view of said circuit layout including said paveover cell; and
generating a second design rule clean database comprising said modified view of said circuit layout, wherein said second database is used for subsequent steps of a design when one or more diffused blocks of said circuit layout are unused in said design.

12. A design tool for automating a process for generating a modified view of a circuit layout comprising:
means for extracting data for base layers of one or more diffused blocks of said circuit layout from a first design rule clean database;
means for forming a paveover cell comprising the extracted base layers, wherein said design tool facilitates reuse of routing resources of said one or more diffused blocks; and
means for generating a second design rule clean database containing said modified view of said circuit layout, wherein said modified view includes said paveover cell.

13. A design tool for automating a process for generating a modified view of a circuit layout comprising:
a first set of computer executable instructions configured to extract data for base layers of one or more unused diffused blocks of a circuit layout from a first database;
a second set of computer executable instructions configured to generate a paveover cell comprising the extracted base layers of said one or more unused diffused blocks; and
a third set of computer executable instructions configured to generate a second database comprising said paveover cell, wherein routing resources of said one or more unused diffused blocks are available for use by other circuitry of said circuit layout.

14. The design tool according to claim 13, wherein:
said first set of computer executable instructions and said second set of computer executable instructions comprise a run deck configured to control a commercially available tool suite.

15. The design tool according to claim 13, wherein:
said first set of computer executable instructions and said second set of computer executable instructions are stored in a computer readable media.

16. The design tool according to claim 13, further comprising:
a fourth set of computer executable instructions configured to perform one or more operations selected from the group consisting of inserting metal utilization information (mu), creating route guides, avoiding crosstalk and avoiding slew errors.

17. The design tool according to claim 13, wherein said design tool is further configured to generate a netlist in response to a layout versus schematic (LVS) verification operation on said paveover cell.

18. The design tool according to claim 13, wherein:
said third set of computer executable instructions are further configured to generate said second database using a metal utilization (mu) annotation file generated in response to a design rule checking (DRC) operation.

19. The design tool according to claim 13, wherein said design tool is configured to present one or more frame views of said paveover cell.

20. The design tool according to claim 13, further comprising:
a fourth set of computer executable instructions configured to (i) compare one or more base layers of said paveover cell to corresponding base layers of said circuit layout and (ii) assure said base layers of said paveover cell correctly compare with said corresponding base layer of said circuit layout.

* * * * *